United States Patent [19]

Schlig

[11] Patent Number: 5,719,523
[45] Date of Patent: Feb. 17, 1998

[54] THRESHOLD CORRECTING REFERENCE VOLTAGE GENERATOR

[75] Inventor: Eugene S. Schlig, Somers, N.Y.

[73] Assignee: International Business Machines Corporation, Armonk, N.Y.

[21] Appl. No.: 747,985

[22] Filed: Nov. 12, 1996

Related U.S. Application Data

[63] Continuation of Ser. No. 431,933, May 1, 1995, abandoned.

[51] Int. Cl.$^6$ ........................................................ G05F 1/10
[52] U.S. Cl. ........................................ 327/543; 327/538
[58] Field of Search ................................ 327/535, 536, 327/537, 538, 541, 543, 546, 78, 374, 389, 391, 427, 434, 436, 437, 288, 131–134, 227

[56] References Cited

U.S. PATENT DOCUMENTS

| | | | |
|---|---|---|---|
| 3,621,281 | 11/1971 | Hagen | 327/133 |
| 4,413,237 | 11/1983 | Baba | 327/133 |
| 4,649,289 | 3/1987 | Nakano | 327/543 |
| 4,728,828 | 3/1988 | Goodnough | 327/541 |
| 4,843,258 | 6/1989 | Miyawaki et al. | 327/541 |
| 4,947,056 | 8/1990 | Jinbo | 327/541 |
| 5,117,177 | 5/1992 | Eaton, Jr. | 323/314 |
| 5,164,621 | 11/1992 | Miyamoto | 327/288 |
| 5,180,928 | 1/1993 | Choi | 327/541 |
| 5,185,721 | 2/1993 | Love et al. | 365/189.06 |
| 5,221,863 | 6/1993 | Motegi | 327/288 |
| 5,268,871 | 12/1993 | Dhong et al. | 365/226 |
| 5,303,191 | 4/1994 | Eagan et al. | 327/288 |

Primary Examiner—Timothy P. Callahan
Assistant Examiner—My-Trang Nu Ton
Attorney, Agent, or Firm—Jay P. Sbrollini; James E. Murray

[57] ABSTRACT

A threshold correcting reference voltage generator in which a capacitor is charged from a first voltage source to a voltage above the desired corrected reference voltage by means of a charging transistor controlled by a clock pulse. A metering transistor has its drain and gate electrodes connected to the capacitor either directly or through a blocking transistor. The source of the metering transistor is connected to a second voltage source which has a value below the desired corrected reference voltage. The charging transistor is then turned off and the blocking transistor, if present, turns on. Charge flows from the source to the drain of the metering transistor, reducing the capacitor voltage until the metering transistor just turns off. At this point the capacitor voltage is higher than the second voltage source by the threshold voltage of the metering transistor. This capacitor voltage is the desired corrected reference voltage; its value depends directly on the magnitude of the metering transistor threshold voltage. Finally the blocking transistor, if present, turns off to isolate the capacitor. The purposes of the blocking transistor are to avoid the direct flow of current between the first and second voltage supplies when the charging transistor is turned on, and to protect the output from errors due to subthreshold conduction in the metering transistor.

19 Claims, 4 Drawing Sheets

THRESHOLD CORRECTING REFERENCE VOLTAGE GENERATOR

This is a continuation of application Ser. No. 08/431,933, filed May 1, 1995 and now abandoned.

TECHNICAL FIELD

This invention relates to MOS analog sampling circuits of the charge metering type, and to avoidance of inaccuracy in their operation due to variation in the threshold voltage of MOS transistors from circuit to circuit.

BACKGROUND ART

Charge metering sampling circuits and some of their applications are set forth in application, Ser. Nos. 07/968,697, (now U.S. Pat. No. 5,400,028) and in U.S. patent application Ser. Nos. 07/968,698 (now U.S. Pat. No. 5,457,415) and 07/968,699 (now U.S. Pat. No. 5,426,430) which are all incorporated herein by reference. Charge metering circuits are of inverting and noninverting types, and a widely useful configuration consists of an inverting stage followed in cascade by an noninverting stage. The inverting stage has an output which is independent of transistor threshold voltages, but the noninverting stage output is reduced by the zero-current threshold voltage of an MOS transistor in that stage, such that, for example, an increase of 0.1 volt in the threshold reduces the output voltage by 0.1 volts. In many applications a moderate variation in the output, such as would be caused by the variation in thresholds between devices on the same integrated circuit chip, would be tolerable. However, the variation in thresholds between different chips is larger and would need correction.

An example of the aforementioned applications is that of the track-and-hold and analog latch stages of a sampled-ramp data line driver circuit for active matrix liquid crystal displays, as set forth in the above referenced application Ser. No. 07/968,699 and the patent issued thereon. Because of the periodic inversion of the liquid crystal cell voltage, the RMS voltage which controls the state of the liquid crystal is insensitive to small output voltage level shifts such as would be caused by threshold variations within a single chip. However the overall threshold variation between circuits on different chips is excessive and must be corrected. (Nevertheless, the present invention is capable of correcting for threshold variations between regions of a chip or on a circuit by circuit basis if required.) The correction must take into account the target circuits' operating conditions which affect their thresholds; the equilibrium current (zero), the source-to-substrate voltage at some input condition, and the source voltage being in equilibrium with the channel potential.

Inverting stages have a feature which offers a unique opportunity to correct for threshold variations in the noninverting stages: A reference voltage is applied to the inverting stages which precisely determines their initial output voltage level. The above referenced patent applications and patents issued thereon point out that the required correction can be accomplished by making the reference voltage applied to the inverting stage depend on the threshold voltage with the correct sense to compensate for the threshold dependence of the output of the noninverting stage.

A conventional approach to providing the threshold correcting reference voltage would involve the use of analog processing using operational amplifiers. The latter are undesirable because they occupy large silicon area, have substantial quiescent power dissipation and, absent added circuit complexity and component trimming after manufacture, exhibit significant offset voltage errors.

SUMMARY OF THE INVENTION

It is an object of the invention to provide a charge metering circuit that generates the threshold correcting reference voltage directly under the required operating conditions without the need for further processing.

It is another object of the present invention to merge the disclosed circuit with the target circuits and share some of the components of the target circuit, thus reducing the required silicon area.

It is a further object of the present invention to provide a circuit which has no quiescent power dissipation and introduces no offset voltage errors.

The invention is preferably embodied in CMOS integrated circuits, but may alternatively be implemented with NMOS or PMOS as would be understood by one skilled in the art. Also, while the invention is described here in terms of preferred transistor types, other choices of NMOS or PMOS for each transistor of the invention are possible with suitable changes in the applied voltages and clock signals. However, the type of the metering transistor in the circuits of the invention should agree with the type of the metering transistor of the noninverting stage of the target circuits, the threshold voltage of which the invention is to correct. In the following description of the invention the metering transistors are assumed to be NMOS.

In an embodiment of the invention, a capacitor is charged from a first voltage source to a voltage above the desired corrected reference voltage by means of a charging transistor controlled by a clock pulse. A metering transistor has its drain and gate electrodes connected to the capacitor either directly or through a blocking transistor. The source of the metering transistor is connected to a second voltage source which has a value below the desired corrected reference voltage. The charging transistor is then turned off and the blocking transistor, if present, turns on. Charge flows from the source to the drain of the metering transistor, reducing the capacitor voltage until the metering transistor just turns off. At this point the capacitor voltage is higher than the second voltage source by the threshold voltage of the metering transistor. This capacitor voltage is the desired corrected reference voltage; its value depends directly on the magnitude of the metering transistor threshold voltage. Finally the blocking transistor, if present, turns off to isolate the capacitor. The purposes of the blocking transistor are to avoid the direct flow of current between the first and second voltage supplies when the charging transistor is turned on, and to protect the output from errors due to subthreshold conduction in the metering transistor. Referring back to the requirement that the operating conditions of the metering transistors of the invention and of the noninverting stage of the target circuits be the same; both have zero current at equilibrium and have the same source to substrate voltage (within tolerances) when the input voltage change of the target circuit is zero. In equilibrium both have the source voltage in equilibrium with the channel potential.

In the instance where each target circuit has a separate threshold correcting reference generator circuit, the capacitor, the charging transistor and the first voltage supply already exist in the target circuit so only the blocking transistor, the metering transistor and the second voltage source need be added. In the instance where the threshold correcting reference generator serves multiple target circuits, it is uneconomical to provide a separate capacitor in the reference generator. Instead, a second embodiment is employed in which the combination of the capacitors of the target circuits constitutes the capacitor for the reference generator. Transistors already present in the target circuits provide the necessary isolation.

DETAILED DESCRIPTION OF THE INVENTION

In the figures, similar reference numbers designate corresponding components.

Figure 1:
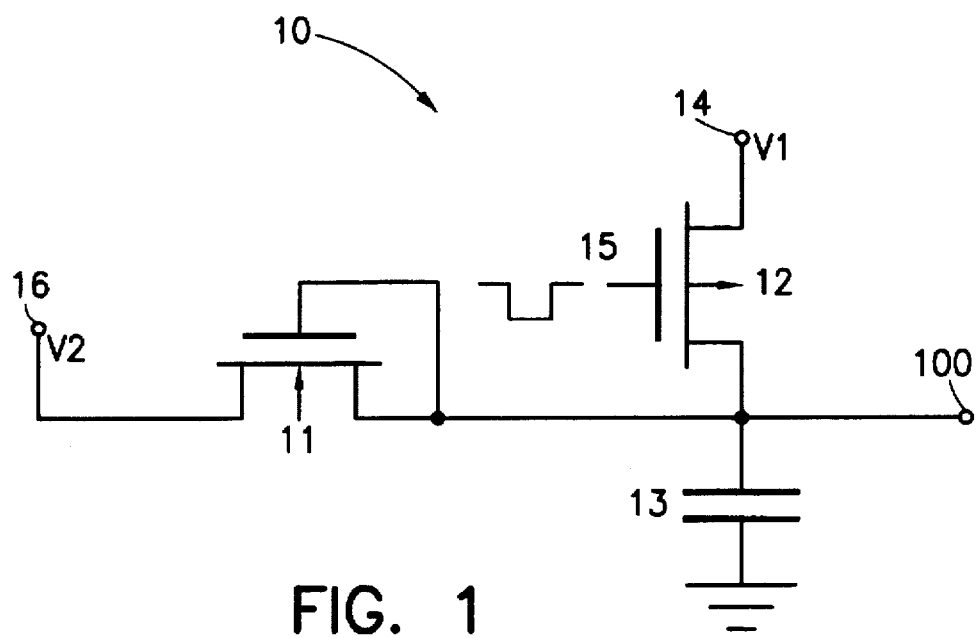
FIG. 1 is a schematic diagram of a rudimentary embodiment of the invention.

A rudimentary embodiment of the circuit of the invention is shown in FIG. 1. The circuit 10 comprises NMOS metering transistor 11, PMOS charging transistor 12, capacitor 13, first voltage supply V1 connected to terminal 14, second voltage supply V2 connected to terminal 16 and output terminal 100. Charging clock pulses are applied to terminal 15.

Figure 2:
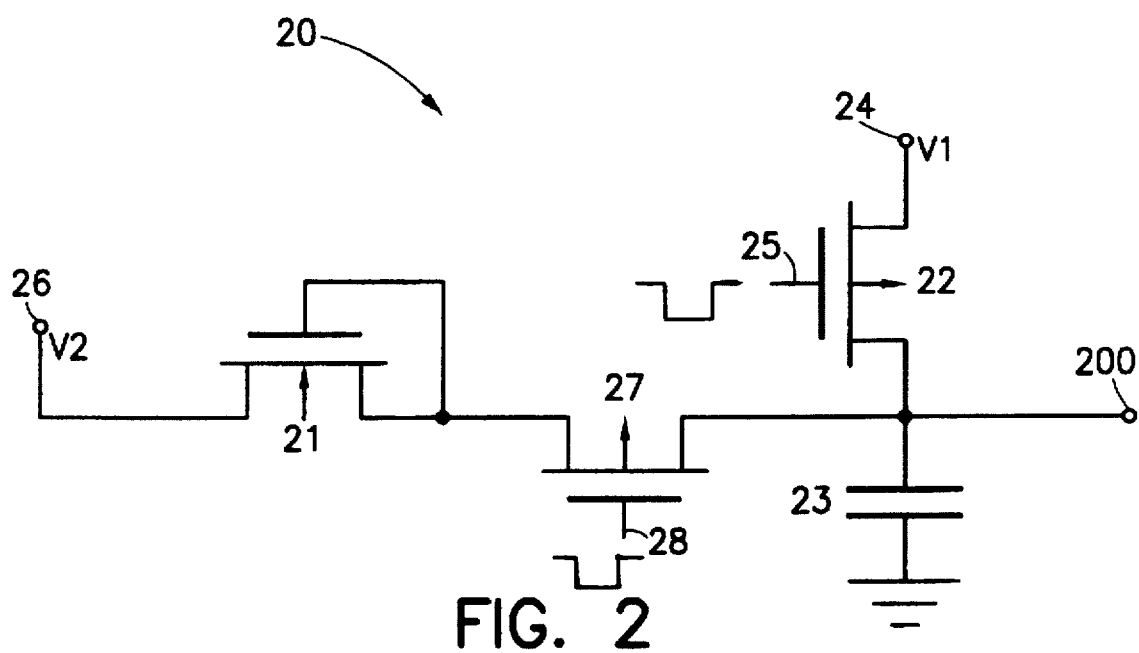
FIG. 2 shows a preferred embodiment of the invention.
Figure 3:
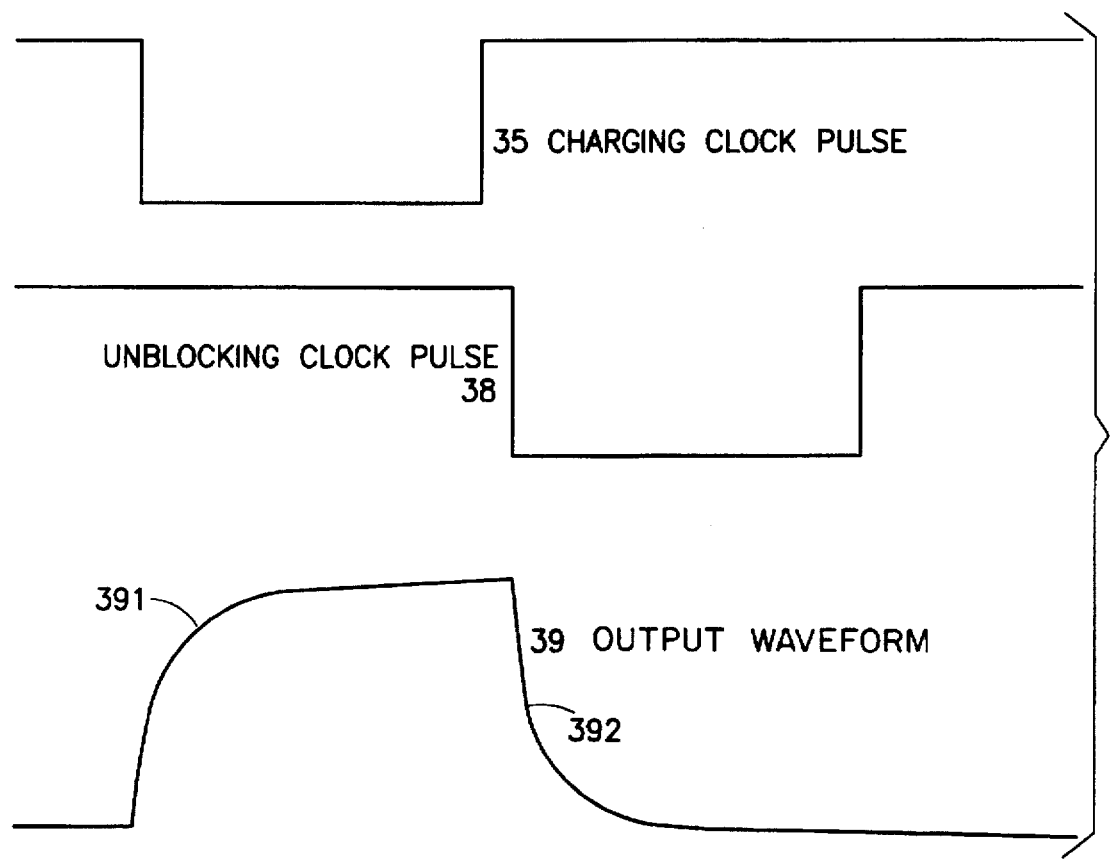
FIG. 3 is a timing and waveform diagram for the circuit of FIG. 2.

FIG. 2 shows a more complete and preferred embodiment, having in addition to components corresponding to FIG. 1 PMOS blocking transistor 27 and unblocking clock pulses applied to terminal 28. Operation will be described for FIG. 2 with the aid of the timing and waveform diagram of FIG. 3. The operation of FIG. 1 will be understood by simply deleting references to transistor 27 and its blocking clock pulses at 28.

The function of the circuits of FIGS. 1 and 2 is to act upon the voltage supplies V1 and V2 to produce at the output a reference voltage which is greater than V2 by the zero-current threshold voltage of metering transistor 11 (FIG. 1) or 21 (FIG. 2). Voltage supply V1 is at least incrementally greater than the largest output voltage to be obtained. The value of V2 is the difference between the desired minimum value of the output and the minimum of the range of the threshold voltage of transistor 21.

At the start of an operating cycle transistors 22 and 27 are off. Transistor 22 is turned on momentarily by charging clock pulse 35 (FIG. 3) at terminal 25, thus charging capacitor 23 toward V1 as shown as rising portion 391 of waveform 39 at terminal 200. After transistor 22 turns off, unblocking clock pulse 38 at terminal 28 momentarily turns transistor 27 on. The output voltage decays, stabilizing when the channel potential of 21 is in equilibrium with V2 so that transistor 21 just turns off. This is shown as falling portion 392 of waveform 39 at terminal 200. At that point, since the gate of transistor 21 is at the output potential (the drop across transistor 27 being negligible), the output is constrained to be greater than V2 by the threshold voltage of transistor 21. To the extent that the threshold voltage of transistor 21 accurately tracks that of the metering device in the noninverting stage of a target circuit, the final output voltage has the value required to correct the target circuit outputs for threshold variations.

Figure 4:
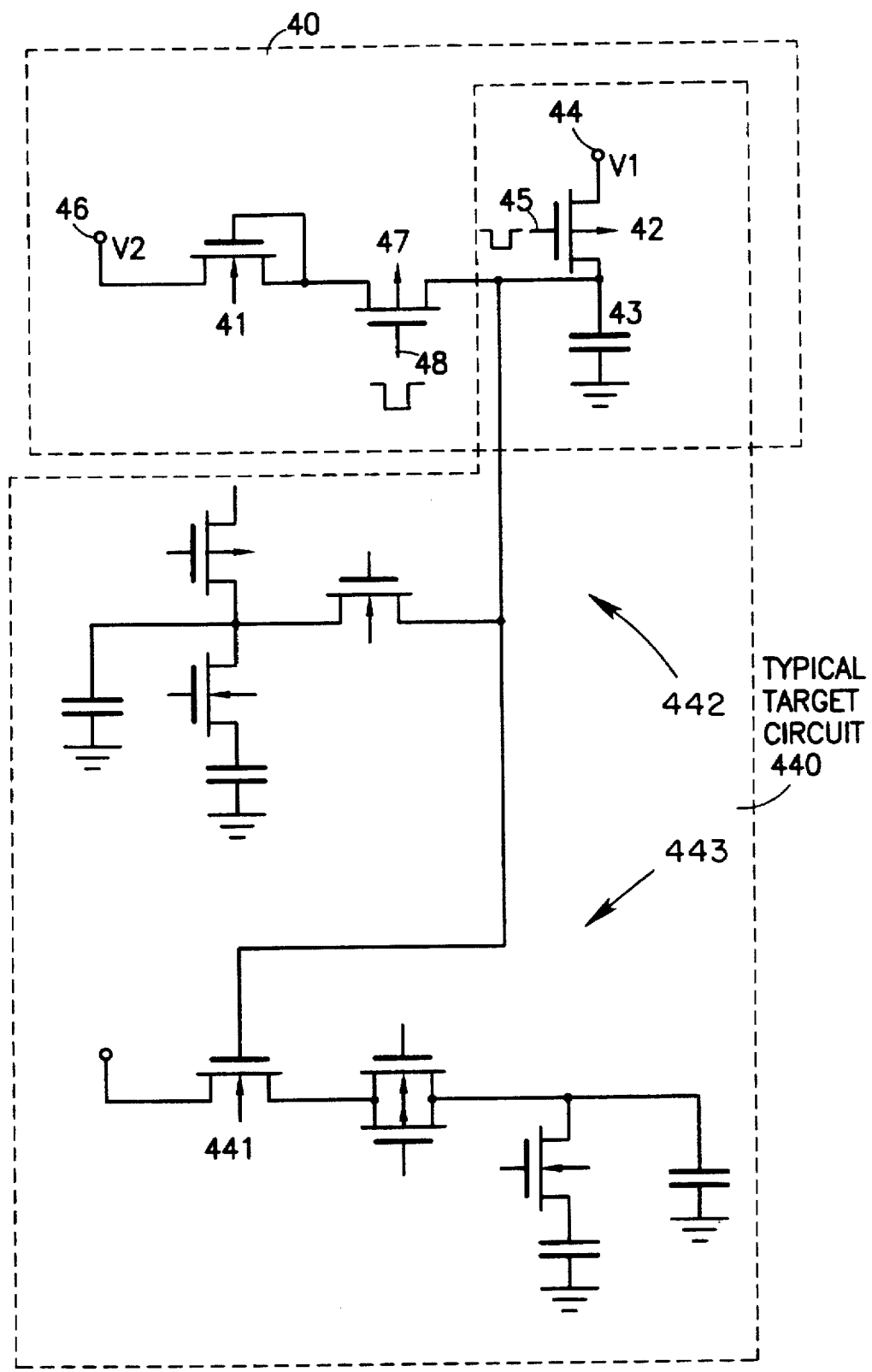
FIG. 4 shows the invention serving, and merged with, a single target circuit.

FIG. 4 shows a preferred embodiment in which reference generator 40, in accordance with the invention, serves a single target circuit 440 between track/hold and analog latch stages 442 and 443 thereof and is merged with it such that charging transistor 42 and capacitor 43 are shared by reference generator 40 and the track/hold stage 442 of the target circuit 440. The target circuit metering transistor of which threshold variations are to be corrected is transistor 441. Operation of reference generator 40 is the same as described above and occurs at the time in the operating cycle of target circuit 440 when the output capacitor 43 of the first stage is to be charged to the reference voltage. For optimum threshold tracking, metering transistor 41 should be located as close as possible to the metering transistor 441 of the analog latch stage 443 of the target circuit, the threshold variation of which is to be corrected.

Figure 5:
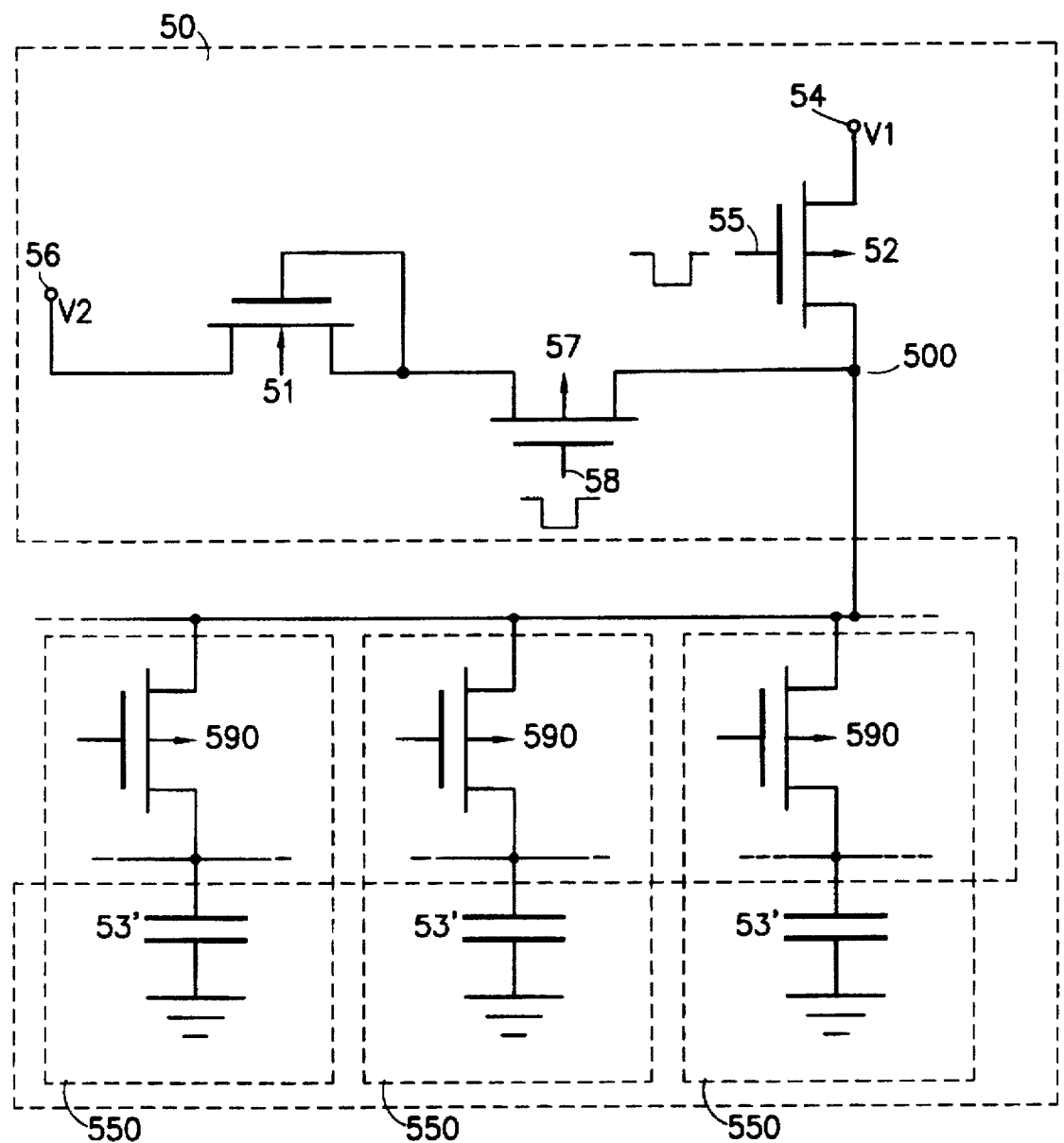
FIG. 5 shows the invention serving, and merged with, multiple target circuits.

FIG. 5 shows a preferred embodiment in which a reference generator 50, in accordance with the invention, serves several target circuits 550. In this case the load capacitance of the reference generator (corresponding to 13, 23 and 43 of the previous embodiments) is provided by the parallel combination of capacitors 53' of all of the served target circuits, and is equal to the sum of their capacitances. Thus, the reference generator is merged with the target circuits. This case differs from that of FIG. 4 in that charging transistor 52 is not shared and a transistor 590 of each target circuit is interposed between reference generator output terminal 500 and the shared capacitors 53'. In operation, 590 is turned on approximately simultaneously with 52 and is turned off after the reference voltage has reached its final value across 53' but preferably before 52 turns off because that sequence minimizes possible charge injection errors. Metering transistor 51 of reference generator circuit 50 should be located as close as possible to a central position relative to the served target circuits to optimize threshold tracking.

As an example a typical metering transistor nominal reference voltage to be supplied to target circuits by the reference generator circuit may be of the order of 7 volts, with a nominal threshold voltage of 1.5 volts and a tolerance on the threshold of plus or minus 0.25 volts. Thus, output voltage of the target circuits will be in the order of 5.5 volts with a tolerance of plus or minus 0.25 volts without correction. This tolerance is too large for LCD driver circuit applications. Use of the threshold correcting circuit in accordance with the invention will generally reduce this variation to a value of several millivolts if each threshold correcting circuit serves a small number of target circuits in close proximity, or a value of several tens of millivolts if each threshold correcting circuit serves all the target circuits on a chip. These are acceptable variations.

What is claimed is:

1. A reference generator circuit comprising:
   a) a capacitor across which a desired corrected reference voltage is to be generated;
   b) a charging source means controlled by a clock pulse for charging said capacitor to a voltage above said desired corrected reference voltage when said charging source means is on; and
   c) a metering means comprising:
      i) a metering transistor having a source, a gate and a drain, said drain and said gate being connected to said capacitor; and
      ii) a voltage source which has a value selected to be smaller than said desired corrected reference voltage which voltage source is connected to the source of the metering transistor so that charge flows between the source and drain of the metering transistor, and when said charging source means is off reduces voltage across the capacitor until the voltage across the metering transistor reaches the threshold voltage of the metering transistor and the metering transistor turns off, whereby the desired corrected reference voltage is present on the capacitor.

2. The circuit of claim 1 in combination with a target circuit for performing a charge metering sampling function, said reference generator circuit for correcting a threshold voltage of said target circuit, wherein said capacitor is a capacitor of said target circuit.

3. The circuit of claim 1 in combination with a target circuit for performing a charge metering sampling function, said reference generator circuit for correcting a threshold voltage of said target circuit, wherein said charging transistor is a transistor of said target circuit.

4. The circuit of claim 1 in a combination with a plurality of target circuits each for performing a charge metering sampling function, said reference generator circuit for correcting a threshold voltage of said target circuits, wherein said capacitor is provided as a capacitance associated with a plurality of said target circuits.

5. The circuit of claim 1 in combination with a plurality of target circuits each for performing a charge metering sampling function, said reference generator circuit for correcting a threshold voltage of said target circuits, wherein each said target circuit has an isolating transistor for controlling charging of a respective capacitor associated with said target circuit.

6. The circuit of claim 1 in combination with a target circuit performing a charge metering sampling function, said reference generator circuit for correcting a threshold voltage of said target circuit, wherein said generator circuit and said target circuit are constructed on the same substrate.

7. The circuit of claim 1 in combination with a plurality of target circuits each performing a charge metering sampling function, said reference generator circuit for correcting a threshold voltage of said target circuits, wherein said generator circuit and said target circuits are constructed on the same substrate.

8. The reference generator circuit of claim 1, further comprising:

a blocking transistor between said metering transistor and said capacitor, said blocking transistor being responsive to a pulse applied after said clock pulse, to allow said charge to flow.

9. The circuit of claim 8 in combination with a target circuit for performing a charge metering sampling function, said reference generator circuit for correcting a threshold voltage of said target circuit, wherein said capacitor is a capacitor of said target circuit.

10. The circuit of claim 8 in combination with a target circuit for performing a charge metering sampling function, said reference generator circuit for correcting a threshold voltage of said target circuit, wherein said charging transistor is a transistor of said target circuit.

11. The circuit of claim 8 in combination with a plurality of target circuits each performing a charge metering sampling function, said reference generator circuit for correcting a threshold voltage of said target circuits, wherein said capacitor is provided as a capacitance associated with a plurality of said target circuits.

12. The circuit of claim 8 in combination with a plurality of target circuits each for performing a charge metering sampling function, said reference generator circuit for correcting a threshold voltage of said target circuits, wherein each said target circuit has an isolating transistor for controlling charging of a respective capacitor associated with said target circuit.

13. The circuit of claim 8 in combination with a target circuit for performing a charge metering sampling function, said reference generator circuit for correcting a threshold voltage of said target circuit, wherein said generator circuit and said target circuit are constructed on the same substrate.

14. The circuit of claim 8 in combination with a plurality of target circuits each performing a charge metering sampling function, said reference generator circuit for correcting a threshold voltage of said target circuits, wherein said generator circuit and said target circuits are constructed on the same substrate.

15. In track-and-hold and analog latch stages of a sampled-ramp data line driver circuit for an active liquid crystal display, the improvement comprising: a reference generator circuit between the track-and-hold and analog latch stages including:

a) a capacitor across which a desired corrected reference voltage to be supplied to the analog latch stage is to be generated;

b) a charging source means controlled by a clock pulse for charging said capacitor to a voltage above said desired corrected reference voltage when said source means is on; and c) a metering means comprising:

i) a metering transistor having a source, a gate and a drain, said drain and said gate being connected to said capacitor; and ii) a voltage source which has a value selected to be smaller than said desired corrected reference voltage which voltage source is connected to the source of the metering transistor so that charge flows between the source and drain of the metering transistor, which charge flow when said charging source means is off reduces voltage across the capacitor until the voltage across the metering transistor reaches the threshold voltage of the metering transistor and the metering transistor turns off, whereby the desired corrected reference voltage is present on the capacitor.

16. The track-and-hold circuit of claim 15 wherein the capacitor and the charging source means includes an output capacitor of the track-and-hold stage and a transistor for charging that output capacitor.

17. The track-and-hold circuit of claim 15 wherein said capacitor includes a plurality of capacitances.

18. The track-and-hold circuit of claim 17 including switch means between each of the capacitances of the plurality of capacitances and the charging source means.

19. The track-and-hold circuit of claim 18 wherein said charging source means is a transistor of the track-and-hold stage.

* * * * *